(12) United States Patent
Zhang

(10) Patent No.: US 8,692,631 B2
(45) Date of Patent: Apr. 8, 2014

(54) BULK ACOUSTIC WAVE RESONATOR AND METHOD OF FABRICATING SAME

(76) Inventor: Hao Zhang, Zhuhai (CN)

( * ) Notice: Subject to any disclaimer, the term of this patent is extended or adjusted under 35 U.S.C. 154(b) by 1037 days.

(21) Appl. No.: 12/577,514

(22) Filed: Oct. 12, 2009

(65) Prior Publication Data

US 2011/0084779 A1    Apr. 14, 2011

(51) Int. Cl.
| | |
|---|---|
| H03H 9/13 | (2006.01) |
| H03H 9/15 | (2006.01) |
| H03H 9/54 | (2006.01) |
| H03H 3/02 | (2006.01) |
| H03H 9/02 | (2006.01) |
| H03H 9/56 | (2006.01) |
| H03H 9/17 | (2006.01) |

(52) U.S. Cl.
CPC ........... *H03H 9/02086* (2013.01); *H03H 9/132* (2013.01); *H03H 9/173* (2013.01); *H03H 9/175* (2013.01); *H03H 9/177* (2013.01); *H03H 9/566* (2013.01); *H03H 3/02* (2013.01)
USPC ........... 333/187; 333/189; 310/324; 310/335; 29/25.35; 29/594

(58) Field of Classification Search
USPC .......... 333/187–192; 310/322, 324, 334, 335; 29/25.35, 594
See application file for complete search history.

(56) References Cited

U.S. PATENT DOCUMENTS

| | | | |
|---|---|---|---|
| 6,060,818 A | 5/2000 | Ruby et al. | |
| 6,839,946 B2 | 1/2005 | Ylilammi et al. | |
| 7,119,638 B2 | 10/2006 | Jun et al. | |
| 7,268,647 B2 * | 9/2007 | Sano et al. | 333/187 |
| 7,369,013 B2 * | 5/2008 | Fazzio et al. | 333/187 |
| 7,498,904 B2 * | 3/2009 | Ohara et al. | 333/189 |

(Continued)

FOREIGN PATENT DOCUMENTS

| | | | |
|---|---|---|---|
| JP | 1-157108 | * | 6/1989 |
| JP | 2006-186412 | * | 7/2006 |
| JP | 2007-295025 | * | 11/2007 |
| JP | 2007-295306 | * | 11/2007 |
| JP | 2008-66792 | * | 3/2008 |

OTHER PUBLICATIONS

English language machine translation of JP 2006-186412, published Jul. 13, 2006.*

(Continued)

*Primary Examiner* — Barbara Summons
(74) *Attorney, Agent, or Firm* — Morris Manning & Martin LLP; Tim Tingkang Xia, Esq.

(57) ABSTRACT

An acoustic resonator with improved quality factor and electro-mechanical coupling is disclosed. In one embodiment, the acoustic resonator includes an acoustic mirror formed on the top surface of a substrate or in the substrate, a first electrode having a end portion, formed on the acoustic mirror, a piezoelectric layer formed on the first electrode; and a second electrode formed on the piezoelectric layer, where at least one of the first electrode and the second electrode and the piezoelectric layer define a gap in a region that overlaps the end portion of the first electrode. In one embodiment, a dielectric film is deposited on the surface of the end portion of the first electrode to form completely planarized surface before the piezoelectric layer deposition. In another embodiment, a gap between the second electrode and the piezoelectric layer, so that the piezoelectric coupling in the end portion area of the first electrode is minimally contributed into the whole resonator.

22 Claims, 15 Drawing Sheets

(56) References Cited

U.S. PATENT DOCUMENTS

| | | | |
|---|---|---|---|
| 7,657,983 B2 * | 2/2010 | Aigner et al. | 29/25.35 |
| 7,978,025 B2 * | 7/2011 | Yokoyama et al. | 333/133 |
| 8,084,919 B2 * | 12/2011 | Nishihara et al. | 310/320 |
| 2005/0231305 A1 * | 10/2005 | Ginsburg et al. | 333/187 |
| 2005/0269904 A1 * | 12/2005 | Oka | 310/324 |
| 2006/0132262 A1 * | 6/2006 | Fazzio et al. | 333/187 |
| 2007/0080611 A1 * | 4/2007 | Yamada et al. | 310/364 |
| 2007/0209174 A1 * | 9/2007 | Aigner et al. | 29/25.35 |
| 2008/0129414 A1 * | 6/2008 | Lobl et al. | 333/187 |
| 2008/0143215 A1 * | 6/2008 | Hara et al. | 310/328 |
| 2010/0327697 A1 | 12/2010 | Choy et al. | |
| 2010/0327994 A1 | 12/2010 | Choy et al. | |

OTHER PUBLICATIONS

English language machine translation of JP 2007-295025, published Nov. 8, 2007.*

English language machine translation of JP 2007-295306, published Nov. 8, 2007.*

G.G. Fattinger et al.; "Spurious Mode Suppression in Coupled Resonator Filters"; 2005 IEEE MTT-S International Microwave Symposium Digest, Jun. 12-17, 2005, pp. 409-412.*

S. J. Martin et al.: "Development of a Low-Dielectric-Constant Polymer for the Fabrication of Integrated Circuit Interconnect" in Adv. Mater., 2000, 12, No. 23, Dec. 1; pp. 1769-1778.

* cited by examiner

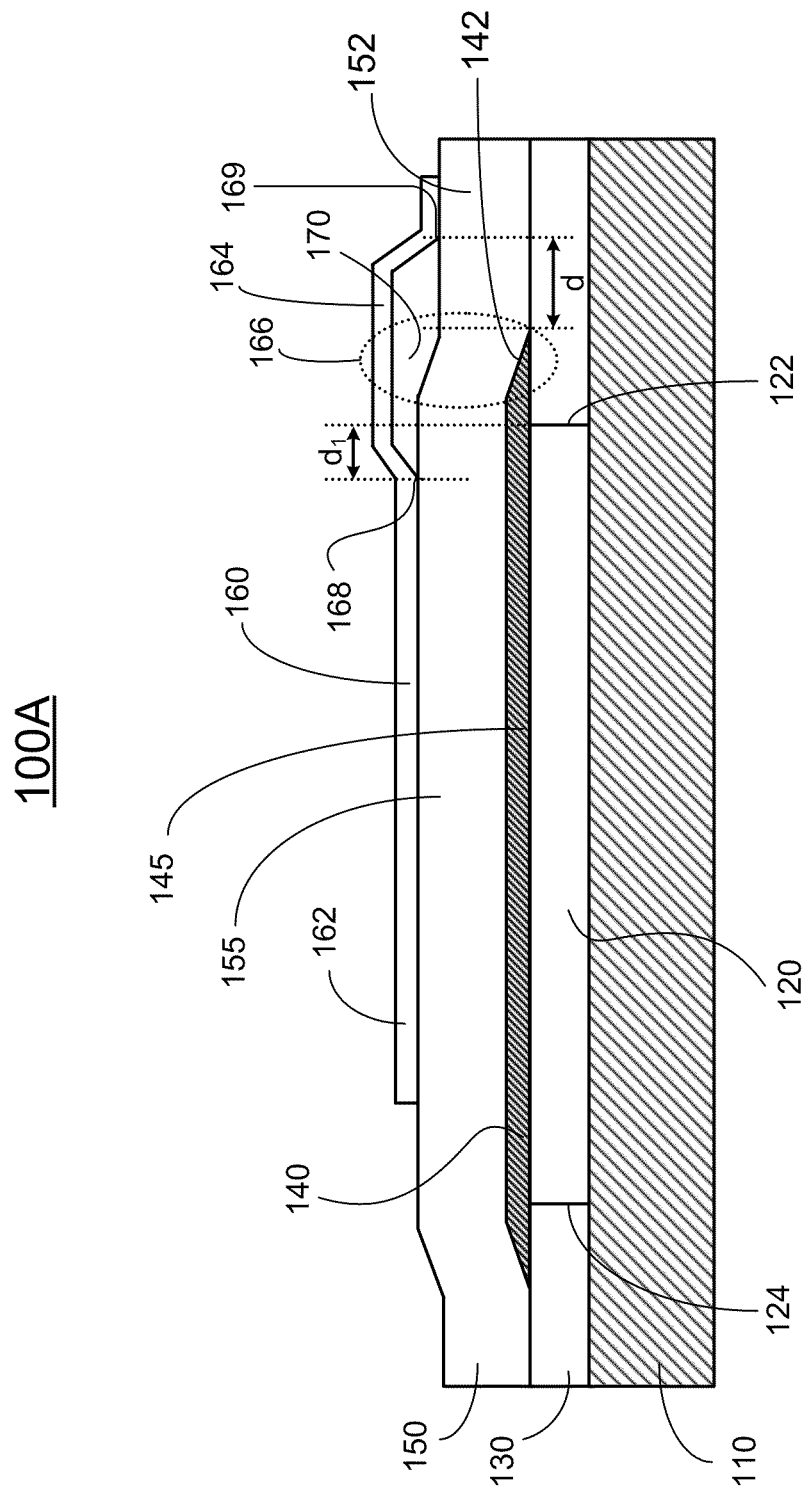

BULK ACOUSTIC WAVE RESONATOR AND METHOD OF FABRICATING SAME

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to piezoelectric thin film devices, and more particular to bulk acoustic wave resonators having enhanced performance and methods of manufacturing same.

BACKGROUND OF THE INVENTION

Thin film Bulk Acoustic Wave (BAW) resonators utilizing the thickness longitudinal resonance of a piezoelectric (PZ) film have emerged as a viable alternative to surface acoustic wave devices and quartz crystal bulk acoustic resonators for mobile communication and high-speed serial data applications. RF front-end BAW filters/duplexers offer superior filtering characteristics such as low insertion loss and sharp roll-off, power handling, and electrostatic discharge (ESD) robustness. High frequency oscillators based on ultra small factor temperature compensated BAW resonators have been shown to demonstrate excellent phase noise, wide tuning range and low power dissipation. Additionally, these miniaturized thin film resonators are fabricated in CMOS-compatible processes on silicon substrate, allowing low unit cost and promising eventual integration with CMOS.

A BAW resonator includes an acoustic mirror and two electrodes between which a PZ layer is arranged, which is called a piezoelectric excitation portion. The lower and upper electrodes also serve as feeding or excitation electrodes to cause a mechanical oscillation in the stacked layers. The acoustic mirror provides acoustical isolation between the BAW structure and a substrate.

FIG. 9 shows a top view of a conventional BAW resonator. The acoustic mirror 82 comprising a selected number of alternating high and low acoustic impedance layers is deposited on the substrate, which is used to transform the acoustic impedance of the substrate approximately into that of air. The major portion of bottom electrode 84 is disposed at an inner side of the contour of the acoustic mirror 82. At the connection edge 88, some portion of the top electrode 86 has to cross over the bottom electrode 84.

Performance of the thin film BAW resonator can be represented by the effective electromechanical coupling coefficient ($K_t^2$) and the quality (Q) factor. The greater the effective $K_t^2$ becomes, the wider the bandwidth of a RF filter or the tuning range of a voltage controlled resonator can be made. It is important that the resonator should be prepared by employing the PZ thin film having the high intrinsic $K_t^2$ and aligning the polarization axis of the PZ film to the direction of the thickness of the film, in order to maximize the effective $K_t^2$. The Q factor relates to the insertion loss when the RF filter is formed, and to the purity of the oscillation of the voltage controlled oscillator. While the oscillation relates to various energy loss mechanisms such as acoustical damping (material losses) and laterally escaping waves determined by boundary conditions of the resonator, high purity of the PZ film exhibiting good columnar grain structures with highly preferred c-axis orientation is prerequisite to achieve good performance of BAW devices. It is known that the texture of the PZ film is strongly dependent on both the roughness and the texture of the underlying electrode upon which it is deposited. A smooth underlayer with a sharp texture is the best possible combination. When the PZ layer is deposited, it follows the terrain of the underlayer and has a tendency to crack when layered over sharp topography, for example, on electrode layer that has a nearly vertical edge making an abrupt end. Cracks in the PZ layer significantly decrease the ESD robustness of resonator.

FIG. 10 shows a top view of a conventional BAW resonator as disclosed by U.S. Pat. No. 6,384,697 to Ruby et al. In the BAW resonator, a method to support an acoustic resonant portion on a substrate is provided. The acoustic resonant portion comprising a PZ layer sandwiched between a bottom electrode 94 and a top electrode 96. In practice, at least one side of the top electrode 96 has to extend beyond the contour of the acoustic mirror to connect with pads or other circuits. The bottom electrode 94 spans the entirety of the cavity 92 functioning as an acoustic mirror. This approach avoids cracks of PZ layer in the free standing membrane and improves the mechanical reliability of resonator. However, the voids or cracks in PZ layer when deposited over the edge of its underlying electrode 94 lead to serious susceptibility to electrostatic discharges. The effective $K_t^2$ of the resonator is reduced when some portion of electrodes sandwiching PZ layer are in contact with substrate.

A tapered end portion of the bottom electrode could be formed in order to prevent cracking and discontinuity in the PZ layer. FIG. 11 shows a cross sectional view of a conventional bulk acoustic wave resonator having a tapered end portion of the bottom electrode. The BAW resonator comprises an acoustic mirror 1120 formed on the top surface of the substrate or in the substrate 1110, and two electrodes 1140 and 1160 between which a piezoelectric layer 1150 is sandwiched. The tapered end portion 1142 of the bottom electrode 1140 could be within or outside (or partially outside) of the contour of the acoustic mirror 1120. The tapered end portion 1142 of the bottom electrode 1140 is typically formed with dry plasma or wet chemical etching process. Compared to other regions not exposed to etching, the etching damaged electrode area has worse grain structure and the etched surface in the tapered end portion area 1142 is much rougher. Both of the Q factor and the effective $K_t^2$ of the resonator formed with the PZ layer deposited in a region 1166 overlapping the tapered end portion 1142 with high surface roughness deteriorate remarkably.

In addition, as disclosed in U.S. Pat. No. 6,924,717 to Ginsburg et al., forming a tapered bottom electrode requires good control of a slop angle and increases the process complexity and manufacturing cost (e.g., the dry etching being excessively long).

People skilled in the art widely recognize that acoustic energy in the form of lateral modes can leak out from sides of the resonator and escapes into the supporting substrate. The acoustic boundary condition at the periphery of the resonator has to be optimized to avoid generating those energy consuming lateral modes. In particular, the acoustic energy escaping from the connection edge region 88 and 1166, as shown in FIGS. 9 and 11, respectively, associated with crossing the bottom electrode with top electrode is identified as one of the dominating sources of loss. It is important to minimize the interaction of lateral modes with the connection edge 88 of the resonator.

Therefore, a heretofore unaddressed need exists in the art to address the aforementioned deficiencies and inadequacies.

SUMMARY OF THE INVENTION

In one aspect, the present invention relates to an acoustic wave resonator. In one embodiment, the acoustic wave resonator has a substrate, an acoustic mirror formed in or on the substrate, having a first edge and an opposite, second edge and a dielectric layer formed on the substrate such that the dielectric layer is substantially in contact with the first and second edges of the acoustic mirror;

The acoustic wave resonator further has a first electrode formed on the acoustic mirror, having a first end portion and an opposite, second end portion defining a body portion therebetween, where at least one of the first and second end portions is formed extending to the dielectric layer. In one embodiment, the first and second end portions of the first electrode are formed to have a tapered profile, a stepwise profile or a vertical profile.

In one embodiment, the first end portion of the first electrode extends beyond the first edge of the acoustic mirror and is situated on the dielectric layer, where the first edge of the acoustic mirror and the junction of the first portion and the second portion of the second electrode define a first distance, $d_1$.

In another embodiment, where the first end portion of the first electrode locates between the first and second edges of the acoustic mirror, where the junction of the body portion and the first end portion of the first electrode and the junction of the first portion and the second portion of the second electrode define a second distance, $d_2$.

The acoustic wave resonator also has a piezoelectric layer formed on the first electrode, having a body portion, a first end portion and a second end portion oppositely extending from the body portion onto the dielectric layer; and a second electrode formed on the piezoelectric layer, having a first portion situated on the body portion of the piezoelectric layer, and a second portion extending from the first portion such that the junction of the first portion and the second portion locates between the first and second edges of the acoustic mirror and the second portion of the second electrode and the first end portion of the piezoelectric layer define a gap therebetween.

In one embodiment, the gap is filled with a dielectric material or air, where the dielectric material comprises silicon oxide, silicon nitride, silicon carbide, porous silica, fluorinated amorphous carbon, fluoro-polymer, parylene, polyarylene ether, hydrogen silsesquioxane (HSQ), crosslinked polyphenylene polymer, bisbenzocyclobutene (BCB), fluorinated silicon dioxide, carbon doped oxide, diamond, or a combination of them.

In one embodiment, the second portion of the second electrode comprises a convex bridge.

In another aspect, the present invention relates to an acoustic wave resonator. In one embodiment, the acoustic wave resonator includes a substrate having a top surface; an acoustic mirror formed on the top surface of the substrate or in the substrate, having a first edge and an opposite, second edge; a first dielectric layer formed on the substrate such that the dielectric layer is substantially in contact with the first and second edges of the acoustic mirror; a first electrode formed over the substrate and overlying the acoustic mirror, having a first end portion and an opposite, second end portion, where at least one of the first and second end portions extends beyond the one of the first and second edges of the acoustic mirror and is situated on the first dielectric layer; a second dielectric layer formed on the acoustic mirror and the first dielectric layer such that the second dielectric layer is substantially in contact with the first and second end portions of the first electrode; a piezoelectric layer formed on the first electrode and the second dielectric layer such that the piezoelectric layer overlapping the first end portion of the first electrode is isolated from the first electrode; and a second electrode deposited on the piezoelectric layer having a portion situated above the acoustic mirror.

In one embodiment, the second dielectric layer comprises a dielectric material of silicon oxide, silicon nitride, silicon carbide, porous silica, fluorinated amorphous carbon, fluoro-polymer, parylene, polyarylene ether, HSQ, crosslinked polyphenylene polymer, BCB, fluorinated silicon dioxide, carbon doped oxide, diamond, or a combination of them.

In yet another aspect, the present invention relates to an acoustic wave resonator. In one embodiment, the acoustic wave resonator includes a substrate having a top surface; an acoustic mirror formed on the top surface of the substrate or in the substrate, having a first edge and an opposite, second edge; a dielectric layer formed on the substrate such that the dielectric layer is substantially in contact with the first and second edges of the acoustic mirror; a first electrode formed over the substrate and overlying the acoustic mirror, having a first end portion and an opposite, second end portion, where the first end portion extends beyond one of the first and second edges of the acoustic mirror and situates on the dielectric layer and the second end portion locates between the first and second edges of the acoustic mirror; a piezoelectric layer formed on the first electrode and extending beyond the second end portion of the first electrode and onto the dielectric layer so as to define a gap therebetween; and a second electrode deposited on the piezoelectric layer having a portion situated above the acoustic mirror and extending crossover the second end portion of the first electrode.

In one embodiment, the gap is filled with a dielectric material having a dielectric constant or air, where the dielectric material comprises silicon oxide, silicon nitride, silicon carbide, porous silica, fluorinated amorphous carbon, fluoro-polymer, parylene, polyarylene ether, HSQ, crosslinked polyphenylene polymer, BCB, fluorinated silicon dioxide, carbon doped oxide, diamond, or a combination of them.

In a further aspect, the present invention relates to an acoustic wave resonator. In one embodiment, the acoustic wave resonator includes a substrate having a top surface; an acoustic mirror formed on the top surface of the substrate or in the substrate, having a first edge and an opposite, second edge; a first electrode formed on the acoustic mirror, having a end portion; a piezoelectric layer formed on the first electrode, the piezoelectric layer having a body portion, a first end portion and a second end portion, and at least one of the first end portion and the second end portion extending beyond the end portion of the first electrode; and a second electrode formed on the piezoelectric layer, where at least one of the first electrode and the second electrode and the piezoelectric layer define a gap in a region that overlaps the end portion of the first electrode.

The acoustic wave resonator further includes a dielectric layer formed on the substrate such that the dielectric layer is substantially in contact with the first and second edges of the acoustic mirror.

In one embodiment, the gap is filled with a dielectric material having a dielectric constant or air, where the dielectric material comprises silicon oxide, silicon nitride, silicon carbide, porous silica, fluorinated amorphous carbon, fluoropolymer, parylene, polyarylene ether, HSQ, crosslinked polyphenylene polymer, BCB, fluorinated silicon dioxide, carbon doped oxide, diamond, or a combination of them.

In yet a further aspect, the present invention relates to a stacked acoustic wave resonator. In one embodiment, the stacked acoustic wave resonator includes an acoustic mirror formed in or on a top surface of the substrate, having a first edge and an opposite, second edge; and a plurality of multilayered piezoelectric structures stacked over the acoustic mirror, where each two adjacent multilayered piezoelectric structures are separated by a decoupling layer, where each multilayered piezoelectric structure comprises a first electrode having a end portion, a second electrode and a piezoelectric layer formed therebetween, and where at least one of the first electrode and the second electrode and the piezoelectric layer define a gap in a region that overlaps the end portion of the first electrode.

In one embodiment, the decoupling layer comprises a single layer or a multilayer. In one embodiment, the gap is filled with a dielectric material or air.

In one aspect, the present invention relates to a method of fabricating an acoustic wave resonator. In one embodiment, the method includes the steps of forming an acoustic mirror having a first edge and an opposite, second edge, on a top surface of a substrate or in the substrate; forming a dielectric layer on the substrate such that the dielectric layer is substantially in contact with the first and second edges of the acoustic mirror; forming a first electrode having a end portion, over the acoustic mirror, the end portion extending beyond the acoustic mirror and onto the dielectric layer; forming a piezoelectric layer on the first electrode and the dielectric layer; and forming a second electrode on the piezoelectric layer such that the second electrode extends beyond the end portion of the first electrode to define a region in which the second electrode overlapping the end portion of the first electrode is isolated from the piezoelectric layer.

In one embodiment, the step of forming the acoustic mirror comprises the step of forming an air cavity functioning as the acoustic mirror on the top surface of the substrate or in the substrate. The step of forming the air cavity comprises the step of forming a sacrificial layer having a shape of the acoustic mirror on the top surface of the substrate. Furthermore, the method also includes the step of removing the sacrificial layer from the substrate to form the acoustic mirror thereon.

In one embodiment, the step of forming the second electrode comprises the steps of forming a sacrificial layer on the piezoelectric layer such that the sacrificial layer covers at least the region overlapping the end portion of the first electrode; depositing the second electrode on the piezoelectric layer and over the sacrificial layer; and removing the sacrificial layer to form a gap between the second electrode and the piezoelectric layer in the region overlapping the end portion of the first electrode. In another embodiment, the step of forming the second electrode comprises the steps of forming a second dielectric layer on the piezoelectric layer such that the dielectric layer covers at least the region overlapping the end portion of the first electrode; and depositing the second electrode on the piezoelectric layer and over the second dielectric layer.

In another aspect, the present invention relates to a method of fabricating an acoustic wave resonator. In one embodiment, the method includes the steps of forming an acoustic mirror having a first edge and an opposite, second edge, on a top surface of a substrate or in the substrate; forming a dielectric layer on the substrate such that the dielectric layer is substantially in contact with the first and second edges of the acoustic mirror; forming a first electrode having a first end portion and an opposite, second end portion, over the acoustic mirror, where the first end portion extends beyond the first edge of the acoustic mirror and onto the dielectric layer and where the second end portion extends beyond the second edge of the acoustic mirror or locates between the first and second edges of the acoustic mirror; forming a piezoelectric layer on the first electrode and extending beyond at least one of the first and second end portions of the first electrode and crossover the first electrode layer so as to define a region in which the piezoelectric layer crossover the first electrode layer is isolated from the first electrode layer; and forming a second electrode deposited on the piezoelectric layer having a portion situated above the acoustic mirror and extending crossover at least one of the first and second end portions of the first electrode and the defined region.

In one embodiment, the step of forming the piezoelectric layer comprises the steps of: depositing a dielectric film on the end portion of the first electrode and an area of the dielectric layer surrounding the end portion of the first electrode to form a planarized surface thereon; and growing the piezoelectric layer on the planarized surface.

In one embodiment, a gap is defined between the piezoelectric layer and the first electrode layer in the region.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 1A shows a cross sectional view of a BAW resonator according to one embodiment of the present invention;

DETAILED DESCRIPTION OF THE INVENTION

Figure 1B:
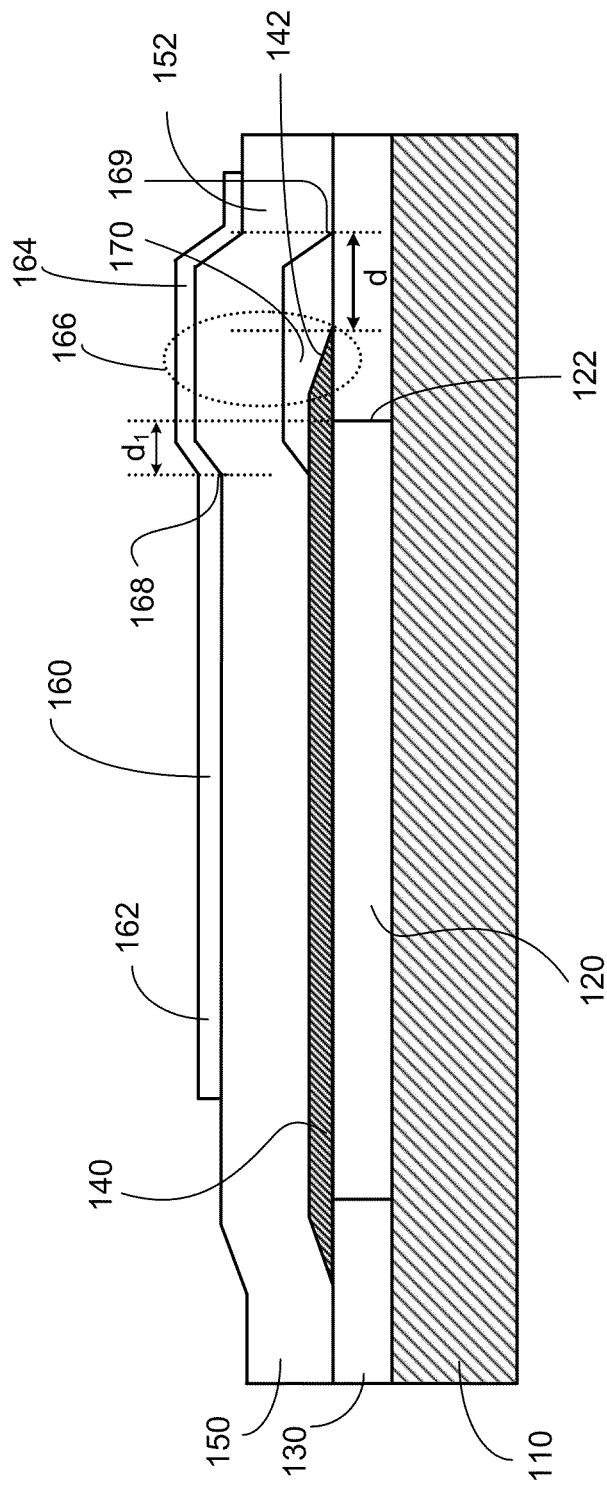
FIG. 1B shows a cross sectional view of a BAW resonator according to another embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

The terms "film" and "layer", as used herein, are interchangeable and refer to a thin sheet of a material deposited or spread over a surface.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings of FIGS. 1-8. In accordance with the purposes of this invention, as embodied and broadly described herein, this invention, in one aspect, relates to a bulk acoustic wave (BAW) resonator with improved $K_t^2$ and Q factor so as to enhance the performance and methods of fabricating the same. In the BAW resonator with the improved $K_t^2$ and Q factor, a resonant excitation portion formed by distorted and poorly formed columnar piezoelectric film caused at the bottom electrode tapered or step edges is minimally contributed into electrical response of the whole resonator and the lateral acoustic energy loss scattering off the connection edge is minimized. One embodiment of the present invention is to form a gap or insert a dielectric layer between one of the two electrodes and the piezoelectric film in the tapered area, this added series low capacitance capacitor results in a considerable reduction in the electrical field in the poorly formed piezoelectric layer region which in turn, on one hand, decreases the electromechanical coupling in that region of resonator, and on the other hand, minimizes the interaction of lateral modes with the connection edge of resonator so that as little as possible acoustic energy is lost through the connection edge into the substrate. Dielectric layer can comprise, for example, silicon oxide, silicon nitride, silicon carbide or other suitable dielectric material. In one embodiment, the dielectric segment can comprise a "low dielectric constant (low-k) dielectric material," such as porous silica, fluorinated amorphous carbon, fluoro-polymer, parylene, polyarylene ether, hydrogen silsesquioxane (HSQ), crosslinked polyphenylene polymer, bisbenzocyclobutene (BCB), fluorinated silicon dioxide, carbon doped oxide, or diamond like carbon. In the present application, a "low-k dielectric material" is defined as a dielectric material having a dielectric constant that is less than the dielectric constant of silicon oxide. In another embodiment, a nominal low cost isotropic wet etching process for the bottom electrode is performed; and no special care need to be taken so as to avoid the sharp discontinuity of the bottom electrode. The voltage drop in the cracked region of the PZ layer is minimized by the gap or filled low-k dielectrics between the top electrode and the PZ film, thereby resulting in minimally negative effect on the Q, $K_t^2$ and ESD robustness of the resonator. Another embodiment is to dispose a dielectric layer whose end coincides with the edge of the electrode within acoustic mirror, preferably by chemical mechanical polishing (CMP) to form a completely planarized and smooth surface, thus facilitate subsequent high quality PZ film growth.

Referring now to FIG. 1A, a BAW resonator 100A is shown according to a first embodiment of the present invention. The BAW resonator 100 includes a substrate 110 and an acoustic mirror 120 that is formed on a top surface of the substrate 110 or in the substrate 110. Although the acoustic mirror 120 as shown in FIG. 1A is provided by an air cavity 120 defined between the substrate 110 and the dielectric layer 130 deposited on the top surface of the substrate 110, it would be appreciated that any other acoustic mirror structure such as a Bragg reflector is also applicable.

The BAW resonator 100A also includes a first electrode 140, a piezoelectric layer 150 and a second electrode 160. The first electrode 140 is deposited on the top surface of the dielectric layer 130 and overlapping the acoustic mirror 120. The first electrode 140 may be etched to form a tapered end portion 142, which extends beyond the contour/edge 122 of the acoustic mirror 120. Additionally, the first electrode 140 may be formed to have an end portion having a stepwise profile, a vertical profile, or the likes.

The piezoelectric layer 150 of a material including, but not limited to, aluminum nitride (AlN), zinc oxide (ZnO), lead zirconate titantate (PZT), quartz, lithium niobate (LiNbO$_3$), potassium niobate (KNbO$_3$), and lithium tantalate (LiTaO$_3$) is deposited on the first electrode 140 and extends on the dielectric layer 130, such that the piezoelectric layer 150 has a step edge upon the tapered end portion 142. The second electrode 160 is deposited on the piezoelectric layer 150. The second electrode 160 includes a portion 162 situated on the piezoelectric layer 150 and a convex bridge 164 protruding on the piezoelectric layer 150. An edge 168 of the portion 162 adjacent the convex bridge 164 is within the contour 122 of the acoustic mirror 120, i.e., a distance ($d_1$) between the edge 168 and the corresponding contour 122 of the acoustic mirror 120. The convex bridge 164 extends from the portion 162 situated on the piezoelectric layer 150 to an outside of the contour of the first electrode 140 and onto the piezoelectric layer 150 (i.e., a distance (d) between the edge 169 of the convex bridge 164 and the end portion 142 of first electrode 140), such that a gap 170 is formed between the convex bridge 164 and the piezoelectric layer 150. This gap 170 isolates the second electrode 160 from the piezoelectric layer 150 in a region 166 overlapping with the tapered end portion 142 of the first electrode 140. In this embodiment, nominal low cost isotropic wet etching process for the first electrode 140 may be performed, and special care doesn't need to be taken to avoid the sharp discontinuity of the first electrode. The voltage drop in the cracked region of the piezoelectric layer is minimized by the gap 170 between the second electrode and the piezoelectric film, thus has minimally negative effect on the Q, $K_r^2$ and ESD robustness of the resonator.

Alternatively in another embodiment, among others, a dielectric layer/film, instead of the gap 170 may be filled between the convex bridge 164 and the piezoelectric layer 150 to isolate the second electrode 160 from the piezoelectric layer 150 in the region 166. This added dielectric film results in a considerable reduction in the electrical field in the poorly formed step region of the piezoelectric layer 150, which in turn decreases the electromechanical coupling in that region of the resonator. The dielectric layer can comprise, for example, silicon oxide, silicon nitride, silicon carbide or other suitable dielectric material. In one embodiment, the dielectric film can comprise a "low dielectric constant (low-k) dielectric material," such as porous silica, fluorinated amorphous carbon, fluoro-polymer, parylene, polyarylene ether, HSQ, crosslinked polyphenylene polymer, BCB, fluorinated silicon dioxide, carbon doped oxide, or diamond like carbon. Commercial low-k polymers are known, for example, from an article by S. J. Martin et al.: "Development of a Low-dielectric-constant Polymer for the Fabrication of Integrated Circuit Interconnect" in Adv. Mater., 2000, 12, No. 23, pp 1769-1778, and are also commercially available.

FIG. 1B shows another embodiment of a BAW resonator 100B according to the present invention. The BAW resonator 100B is similar to the BAW resonator 100A shown in FIG. 1A, except that the gap or the dielectric layer 170 is formed between the piezoelectric layer 150 and the first electrode 140 in the region 166.

Figure 2A:
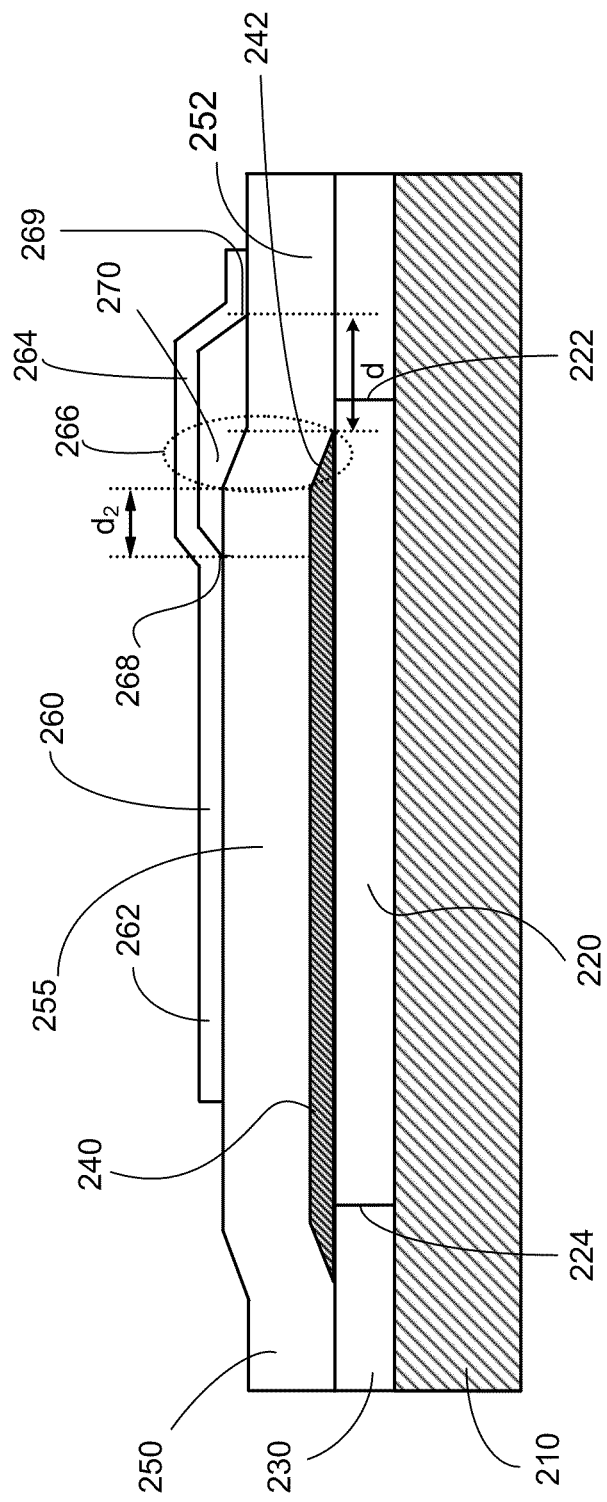
FIG. 2A shows a cross sectional view of a BAW resonator according to yet another embodiment of the present invention.

Referring to FIG. 2A, a BAW resonator 200A is shown according to a second embodiment of the present invention. The BAW resonator 200A comprises a substrate 210, an acoustic mirror 220 formed in or on the substrate 210, having a first edge 222 and an opposite, second edge 224, a dielectric layer 230 formed on the substrate 210 such that the dielectric layer 230 is substantially in contact with the first and second edges of the acoustic mirror 220, a first electrode 240 formed on the acoustic mirror 220, having a first end portion 242 and an opposite, second end portion defining a body portion therebetween, where the first end portion 242 is located between the first edge 222 and the second edge 224 of the acoustic mirror 220, a piezoelectric layer 250 formed on the first electrode 240, having a body portion 255, a first end portion 252 and a second end portion oppositely extending from the body portion onto the dielectric layer 230; and a second electrode 260 formed on the piezoelectric layer 250, having a first portion 262 situated on the body portion 255 of the piezoelectric layer 250, and a second portion 264 extending from the first portion 262 such that the junction 268 of the first portion 262 and the second portion 264 locates between the first and second edges 222 and 224 of the acoustic mirror 220 and the second portion 264 and the first end portion 252 of the piezoelectric layer 250 define a gap 270 therebetween. The second portion 264 of the second electrode 260 includes a convex bridge 264 and there is a distance (d) between the edge 269 of the convex bridge 264 and the end portion 242 of first electrode 240.

The BAW resonator 200A has a similar laminated structure as the BAW resonator 100A shown in FIG. 1A. However, in the BAW resonator 200A, the first end portion 242 of the first electrode 240 resides within the contour 222 of the acoustic mirror 220, and the junction 268 of the first portion 262 and the convex bridge 264 of the second electrode 260 is within the corresponding edge 242 of the first electrode 240. That is, a distance ($d_2$) between the edge 268 and the corresponding edge of the first electrode 240. The convex bridge 264 extends from the portion 262 situated on the piezoelectric layer to an outside of the contour of the first electrode 240 and onto the piezoelectric layer 250, such that a gap 270 is formed between the convex bridge 264 and the piezoelectric layer 250. This gap 270 isolates the second electrode 260 from the piezoelectric layer 250 in a region 266 overlapping with the tapered end portion 242 of the first electrode 240, such that resonant excitation portion formed in the region 266 is minimally contributed into electrical response of the whole BAW resonator 200.

Alternatively in a further embodiment, among others, a dielectric layer, instead of the gap 270 may be filled between the convex bridge 264 and the piezoelectric layer 250 to isolate the second electrode 260 from the piezoelectric layer 250 in the region 266. This added dielectric layer 270 results in a considerable reduction in the electrical field in the poorly formed step region of the piezoelectric layer 250, which in turn decreases the electromechanical coupling in that region of the resonator. The dielectric layer 230 can comprise, for example, silicon oxide, silicon nitride, silicon carbide or other suitable dielectric material. In one embodiment, the added dielectric layer 270 can comprise a "low dielectric constant (low-k) dielectric material," such as porous silica, fluorinated amorphous carbon, fluoro-polymer, parylene, polyarylene ether, HSQ, crosslinked polyphenylene polymer, BCB, fluorinated silicon dioxide, carbon doped oxide, or diamond like carbon. As described above, a "low-k dielectric material" is defined as a dielectric material having a dielectric constant that is less than the dielectric constant of silicon oxide.

Figure 2B:
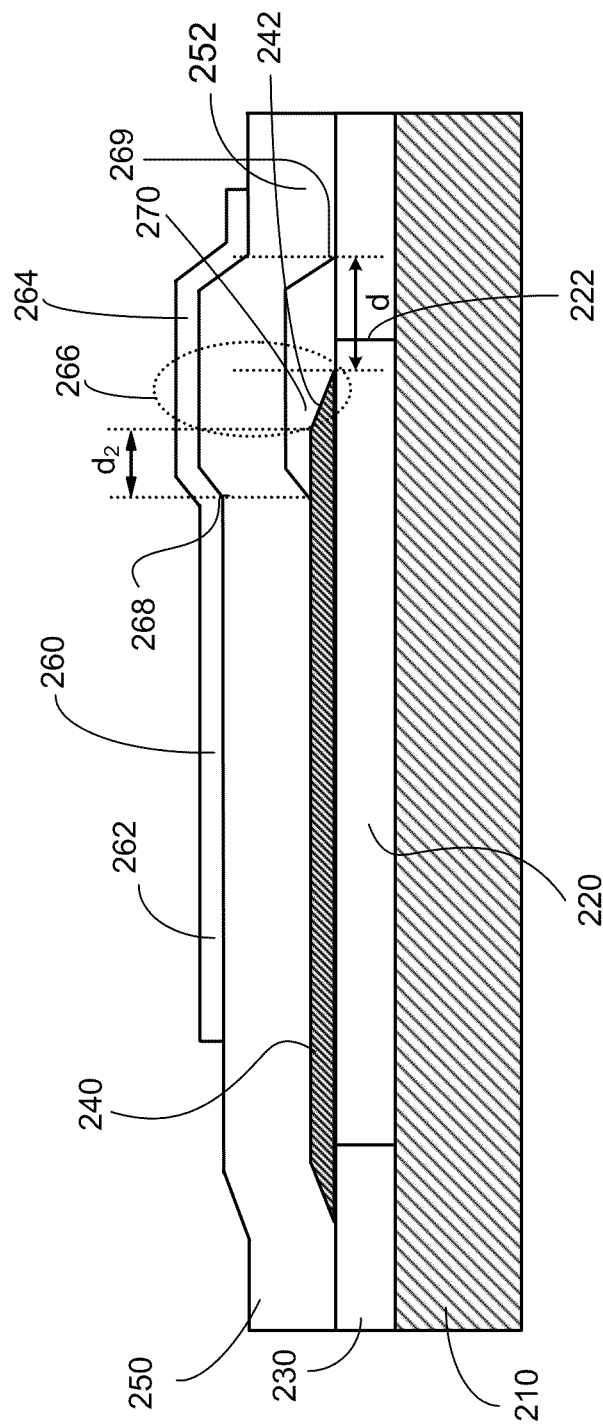
FIG. 2B shows a cross sectional view of a BAW resonator according to a further embodiment of the present invention.

FIG. 2B shows another embodiment of a BAW resonator 200B according to the present invention. The BAW resonator 200B is similar to the BAW resonator 200A shown in FIG. 2A, except that the gap or the dielectric layer 270 is formed between the piezoelectric layer 250 and the first electrode 240 in the region 266.

Figure 3:
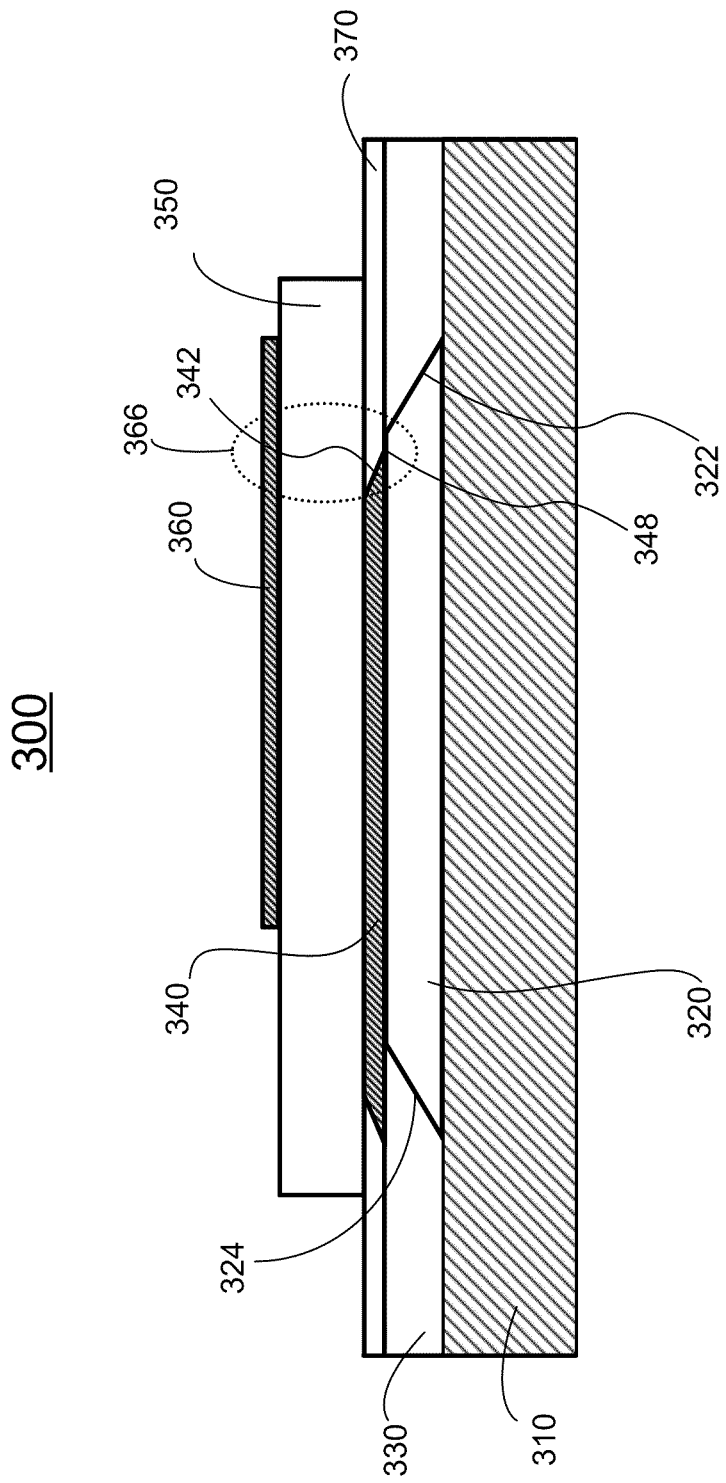
FIG. 3 shows a cross sectional view of a BAW resonator according to yet a further embodiment of the present invention.

Referring now to FIG. 3, a BAW resonator 300 is shown according to one embodiment of the present invention. The BAW resonator 300 comprises a substrate 310 having an acoustic mirror 320 on a top surface of the substrate 310 or in the substrate 310. The acoustic mirror 320 as shown in FIG. 3 is provided by an air cavity 320 in the dielectric layer 330 deposited on the top surface of the substrate 310. Any other acoustic mirror structure such as a Bragg reflector can also be utilized to practice the present invention. A first electrode 340 is deposited on the top surface of the dielectric layer 330 and over the acoustic mirror 320, and the first electrode 340 is etched forming a tapered end portion 342. Furthermore, a tapered end portion edge of the first electrode 340 terminates within the contour 322 of the acoustic mirror 320.

A dielectric layer 370 is deposited on the acoustic mirror 320 and on the dielectric layer 320. An inner end of the dielectric layer 370 coincides with the tapered end portion 342 of the first electrode 340 to form a planarized and smooth surface, thus enabling growth of highly C-axis textured PZ film upon the junction region of the first electrode 340 and dielectric layer 370. The dielectric layer 370 comprises, for example, silicon oxide, silicon nitride, silicon carbide or other suitable dielectric material. Preferably, the dielectric layer 370 comprises a "low dielectric constant (low-k) dielectric material," such as porous silica, fluorinated amorphous carbon, fluoro-polymer, parylene, polyarylene ether, HSQ, crosslinked polyphenylene polymer, BCB, fluorinated silicon dioxide, carbon doped oxide, or diamond like carbon. As described above, a "low-k dielectric material" is defined as a dielectric material having a dielectric constant that is less than the dielectric constant of silicon oxide.

A piezoelectric layer 350 is deposited on the first electrode 340 and on the dielectric layer 370, thus the piezoelectric layer 350 is isolated from the first electrode 340 by the dielectric layer 370 in a region 366 overlapping the tapered end portion 342 of the first electrode 340. A second electrode 360 is deposited on the piezoelectric layer 350, including a portion situated above the acoustic mirror 320.

Since the dielectric layer 370 isolates the piezoelectric layer 350 from the first electrode 340 in the region 366 overlapping the tapered end portion 342 of the first electrode 340, resonant excitation portion formed in the region 366 is minimally contributed into electrical response of the whole BAW resonator 300.

Figure 4:
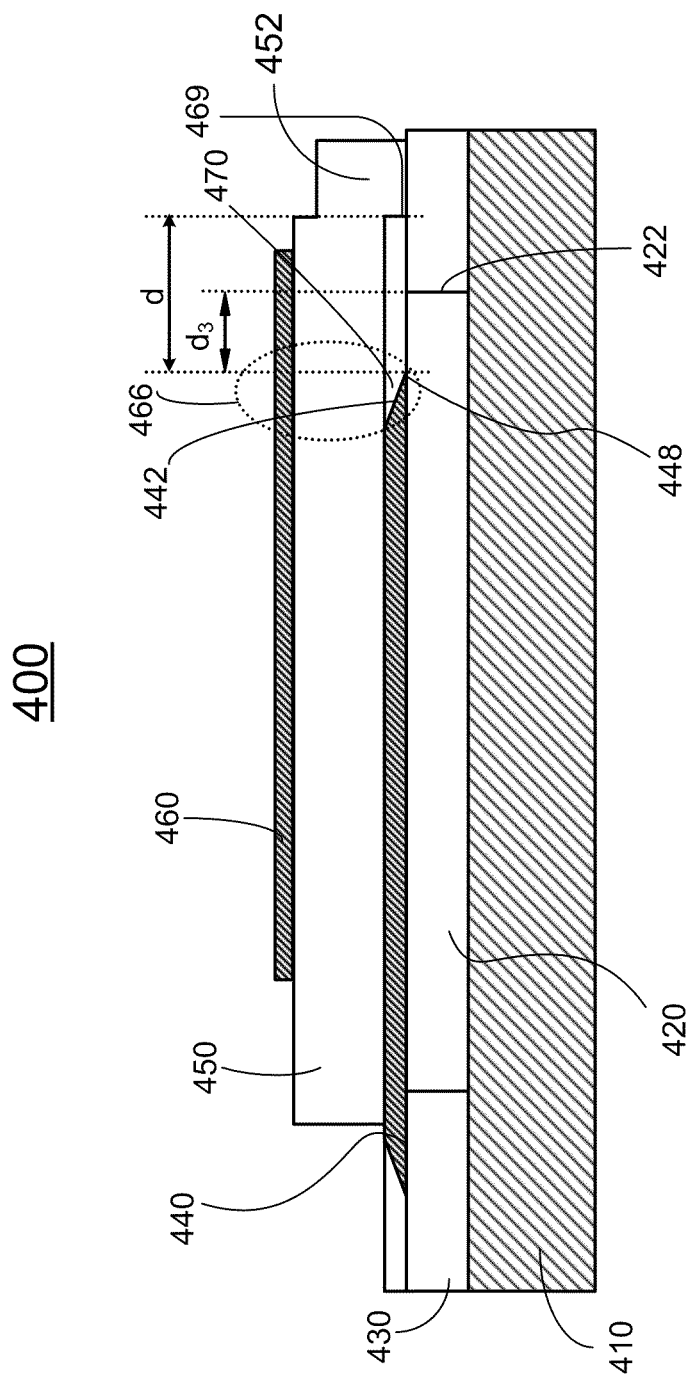
FIG. 4 shows a cross sectional view of a BAW resonator according to one embodiment of the present invention.

Referring now to FIG. 4, a BAW resonator 400 is shown according to a fourth embodiment of the present invention. The BAW resonator 400 comprises a substrate 410 having an acoustic mirror 420 in or on a top surface thereof. While the acoustic mirror 420 as shown in FIG. 4 is provided by an air cavity 420 in the dielectric layer 430 deposited on the top surface of the substrate 410, any other acoustic mirror structure such as a Bragg reflector is also applicable. A first electrode 440 is deposited on the dielectric layer 430 and over the acoustic mirror 420, and the first electrode 440 is etched forming a tapered end portion 442. Additionally, an tapered end portion edge 448 of the first electrode 440 terminates within the contour 422 of the acoustic mirror 420, i.e., there is a distance ($d_3$) between the tapered end portion edge 448 of the first electrode and the corresponding contour 422 of the acoustic mirror 420.

A piezoelectric layer 450 is deposited on the first electrode 440. The piezoelectric layer 450 extends beyond the tapered end portion 442 of the first electrode 440 and onto the dielectric layer 430, such that a gap 470 is formed between the piezoelectric layer 450 and the tapered end portion 442 of the first electrode 440 and the acoustic mirror 420 and/or the dielectric layer 430 (i.e., there is a distance (d) between the edge 469 of the end portion 452 of the piezoelectric layer 450 and the end portion 442 of first electrode 440.). A second electrode 460 is deposited on the piezoelectric layer 450, including a portion situated above the acoustic mirror 420.

The gap 470 isolates the piezoelectric layer 450 from the first electrode 440 in a region 466 overlapping the tapered end portion 442 of the first electrode 440, such that resonant excitation portion formed in the region 466 is minimally contributed into electrical response of the whole BAW resonator 400.

Referring now to FIGS. 5A-5H, a sequence of fabrication processes is shown for producing the BAW resonator 100A according to one embodiment of the present invention. It would be appreciated that the BAW resonator 100A can also be manufactured by various production methods including a modification of the embodiment, other than the sequence of fabrication processes disclosed by the following example.

Figure 5A:
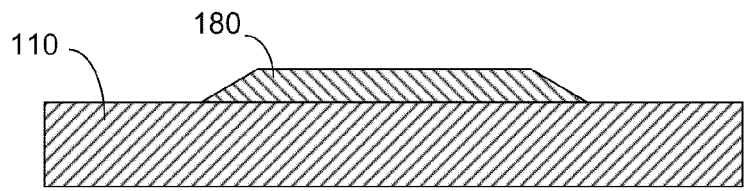
FIGS. 5A-5H are cross sectional views showing a fabrication process of the BAW resonator shown in FIG. 1.

At the step shown in FIG. 5A, a sacrificial material such as silicon oxide, polysilicon, metal (e.g., germanium, magnesium, aluminum, etc), polymer is deposited on the substrate 110, using a sputtering process, a chemical vapor deposition (CVD) process, a physical vapor deposition (PVD) process, spin coating, or other appropriate process. And the sacrificial material is delineated by an appropriate method such as photolithography, so as to form a sacrificial layer 180 having a predetermined shape.

Figure 5B:
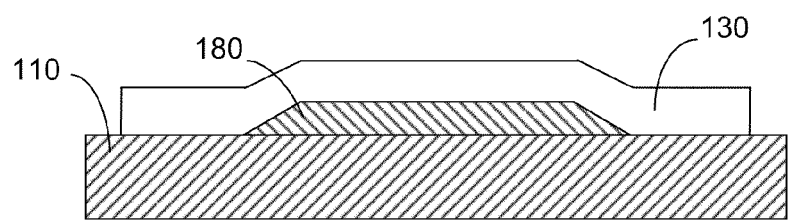

At the step shown in FIG. 5B, a dielectric layer 130 is deposited on the sacrificial layer 180 and on the substrate 110 using a sputtering process, a chemical vapor deposition (CVD) process, a physical vapor deposition (PVD) process, or other appropriate process.

Figure 5C:
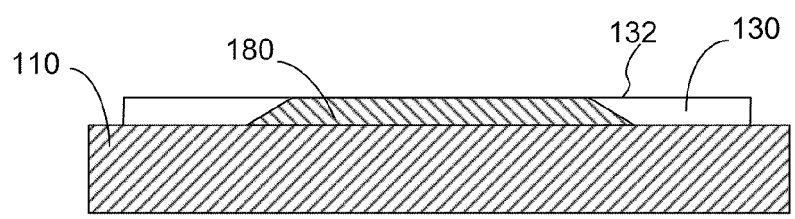

At the step shown in FIG. 5C, an upper portion of the dielectric layer 130 above the sacrificial layer 180 is removed, for example, by chemical mechanical polishing (CMP) to form a completely planarized surface 132 on which a first electrode 140 will be deposited.

Figure 5D:
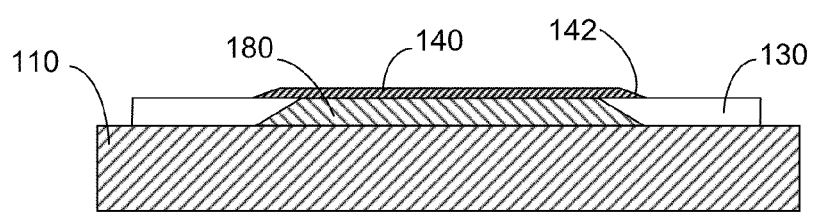

At the step shown in FIG. 5D, a first electrode material such as tungsten (W), molybdenum (Mo), platinum (Pt), ruthenium (Ru), iridium (Ir), titanium tungsten (TiW), aluminum (Al), or the like, is deposited on the sacrificial layer 180 using a sputtering process, a chemical vapor deposition (CVD) process, a physical vapor deposition (PVD) process, or other appropriate process. And the first electrode material is delineated so as to form the first electrode 140. For example, the first electrode 140 may be etched with dry plasma or wet chemical etching process so as to form a tapered end portion 142.

Figure 5E:
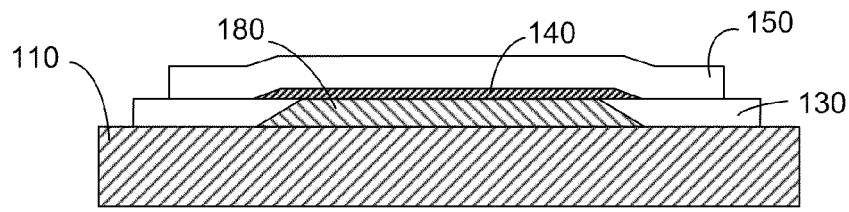

At the step shown in FIG. 5E, a piezoelectric layer 150 is deposited on the first electrode 140 and on the dielectric layer 130 using RF magnetron sputtering process, or the likes. The piezoelectric layer 150 poorly grows at the step region overlapping the tapered end portion 142 of the first electrode 140.

Figure 5F:
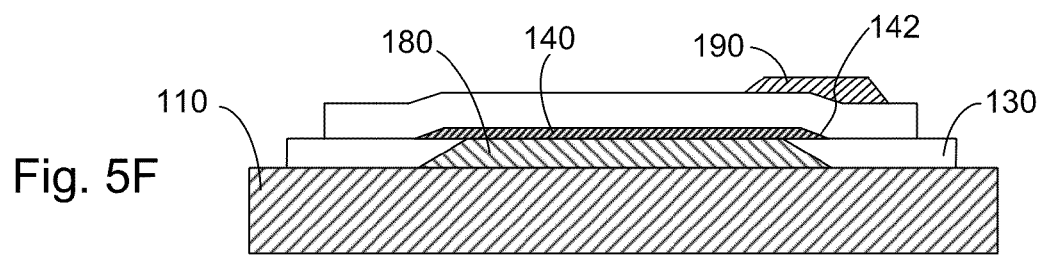

At the step shown in FIG. 5F, a sacrificial material is deposited on the piezoelectric layer 150 using a sputtering process, a chemical vapor deposition (CVD) process, a physical vapor deposition (PVD) process, spin coating, or other appropriate process. And the sacrificial material is delineated by an appropriate method such as photolithography, so as to form a sacrificial layer 190 covering a region overlapping the tapered end portion 142 of the first electrode 140.

Figure 5G:
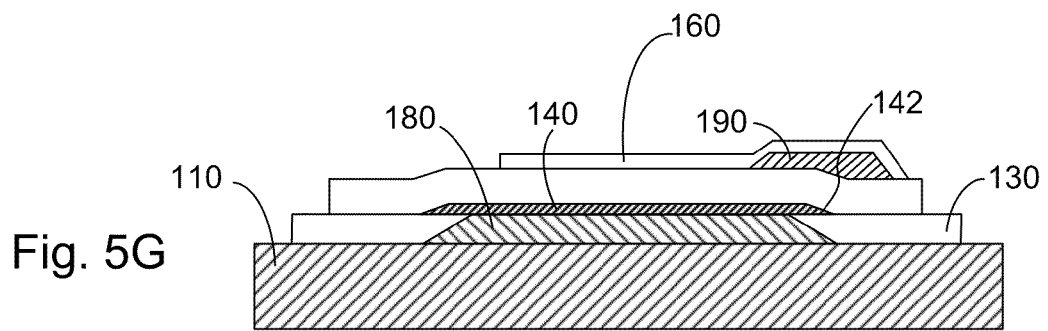

At the step shown in FIG. 5G, a second electrode material such as tungsten (W), molybdenum (Mo), platinum (Pt), ruthenium (Ru), iridium (Ir), titanium tungsten (TiW), aluminum (Al), or the like, is deposited on the piezoelectric layer 150 and over the sacrificial layer 190 to form a second electrode layer 160.

Figure 5H:
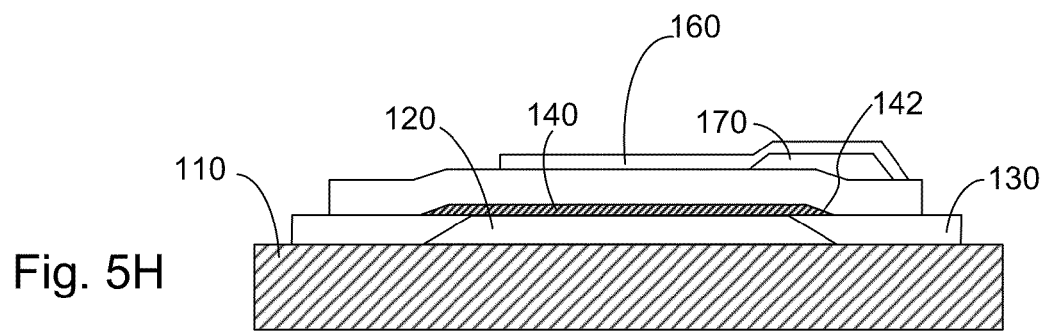

At the step shown in FIG. 5H, the sacrificial layer 190 is removed with etching solution, so as to form a gap 170 as shown in FIG. 1. And the sacrificial layer 180 is also removed so as to form an air cavity functioning as an acoustic mirror 120.

Alternatively, a dielectric layer is formed, instead of the gap 170 for isolating the second electrode 160 from the piezoelectric layer 150 in the region overlapping the tapered end portion 142 of the first electrode 140. In this method, after the same processes shown in FIGS. 5A-5E, a dielectric material, instead of the sacrificial material is deposited on the piezoelectric layer 150 and delineated so as to form a dielectric layer 190 covering the region overlapping the tapered end portion 142 of the first electrode 140. Then a second electrode 160 is deposited on the piezoelectric layer 150 and over the dielectric layer 190, and an overlap of the first electrode 140, the piezoelectric layer 150 and the second electrode 160 forms an acoustic resonant portion of the resonator 100A.

Referring now to FIGS. 6A-6H, a sequence of fabrication processes for producing a BAW resonator 300 is shown according to the third embodiment of the present invention.

Figure 6A:
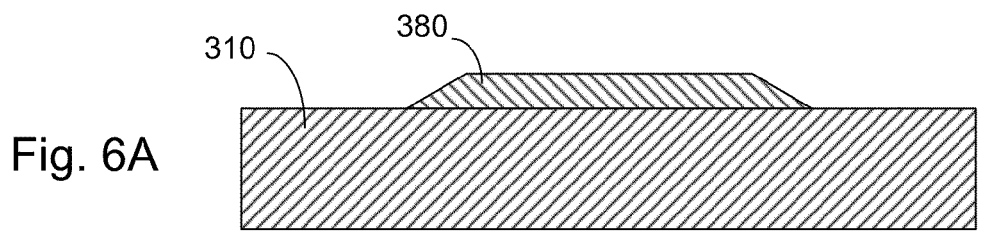
FIGS. 6A-6H are cross sectional views showing a fabrication process of the BAW resonator shown in FIG. 3.

First, as shown in FIG. 6A, a sacrificial material is deposited on the substrate 310. The sacrificial material is then delineated by an appropriate method such as photolithography, so as to form a sacrificial layer 380 having a predetermined shape.

Figure 6B:
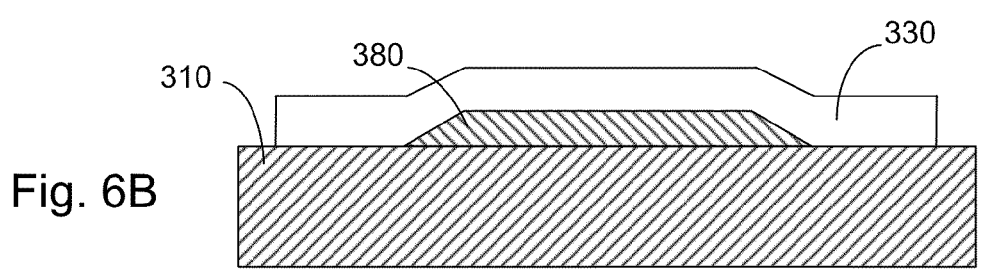

Next, as shown in FIG. 6B, a dielectric layer 330 is deposited on the sacrificial layer 380 and on the substrate 310.

Figure 6C:
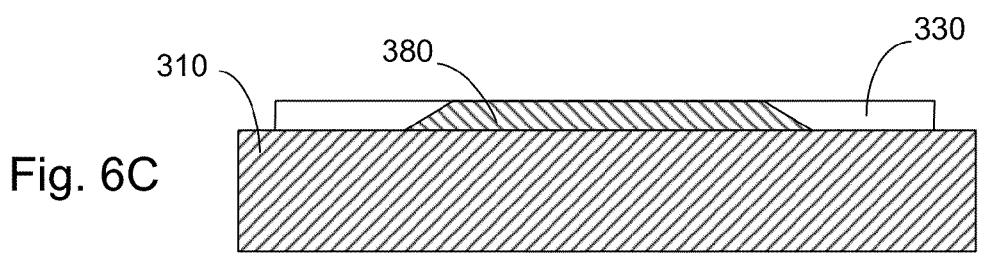

Afterwards, as shown in FIG. 6C, an upper portion of the dielectric layer 330 above the sacrificial layer 380 is removed, for example, by chemical mechanical polishing (CMP) to form a completely planarized surface.

Figure 6D:
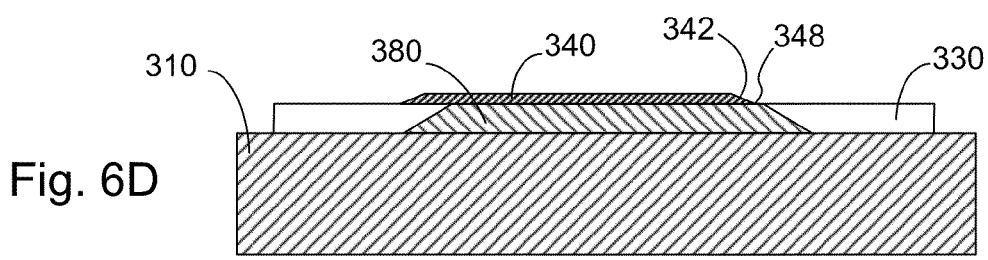

Subsequently, as shown in FIG. 6D, a first electrode material is deposited on the sacrificial layer 380 using RF magnetron sputtering. The first electrode material is then delineated so as to form a first electrode 340. For example, the first electrode 340 is etched with dry plasma or wet chemical etching process so as to form a tapered end portion 342. And an edge 348 of the first electrode 340 terminates within the contour of the sacrificial layer 380.

Figure 6E:
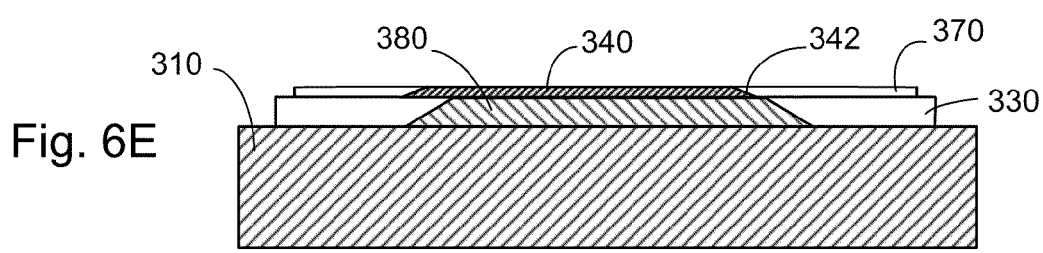

Next, as shown in FIG. 6E, a dielectric layer 370 is deposited on the sacrificial layer 380 and the dielectric layer 330. The dielectric layer 370 is processed, for example, by chemical mechanical polishing (CMP) to coincide with the tapered end portion 342 of the first electrode 340 and form a planarized and smooth surface. The dielectric layer 370 comprises, for example, silicon oxide, silicon nitride, silicon carbide or other suitable dielectric material. Preferably, the dielectric layer 370 comprises a "low dielectric constant (low-k) dielectric material," such as porous silica, fluorinated amorphous carbon, fluoro-polymer, parylene, polyarylene ether, HSQ, crosslinked polyphenylene polymer, BCB, fluorinated silicon dioxide, carbon doped oxide, or diamond like carbon. As described above, a "low-k dielectric material" is defined as a dielectric material having a dielectric constant that is less than the dielectric constant of silicon oxide.

Figure 6F:
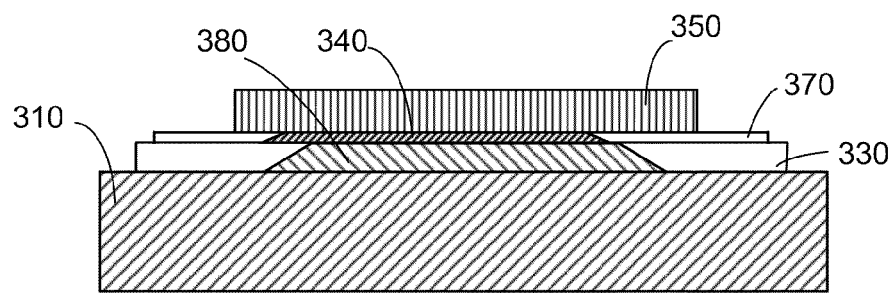

Afterwards, as shown in FIG. 6F, a piezoelectric layer 350 is deposited on the first electrode 340 and the dielectric layer 370, thereby isolating the piezoelectric layer 350 from the first electrode 340 by the dielectric layer 370 in a region overlapping the tapered end portion 342 of the first electrode 340.

Figure 6G:
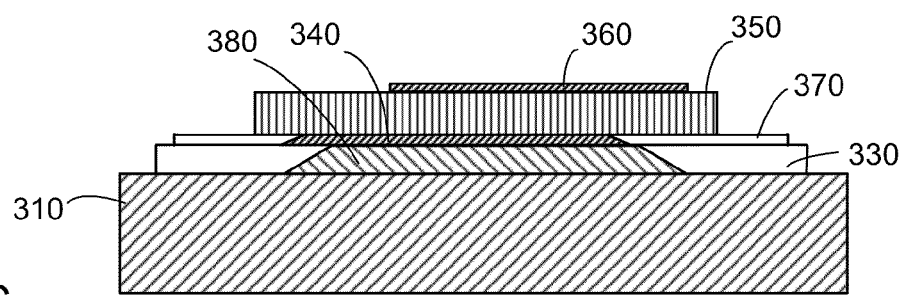

Subsequently, as shown in FIG. 6G, a second electrode material is deposited on the piezoelectric layer 350 and delineated to form a second electrode layer 360 having a portion situated above the acoustic mirror 320.

Figure 6H:
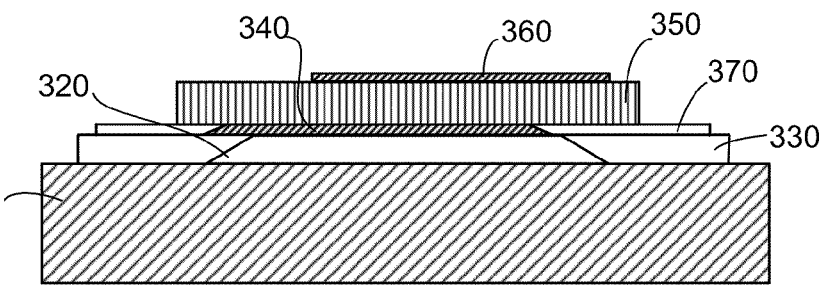

Finally, as shown in FIG. 6H, the sacrificial layer 380 is removed with an etching solution entering through the access releasing hole (not showing) so as to form an air cavity functioning as an acoustic mirror 320.

Referring now to FIGS. 7A-7H, a sequence of fabrication processes is shown for producing a BAW resonator 400 according to a fourth embodiment of the present invention.

Figure 7A:
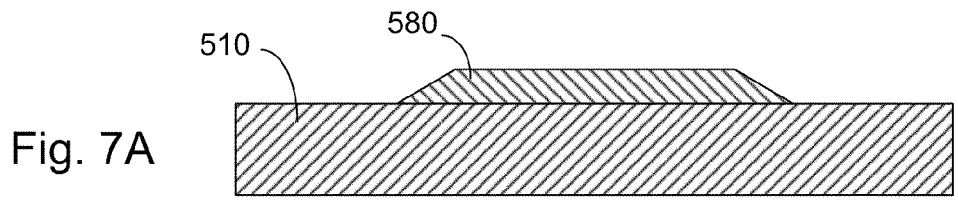
FIGS. 7A-7H are cross sectional view showing a fabrication process of a BAW resonator shown in FIG. 4.

First, as shown in FIG. 7A, a sacrificial material is deposited on the substrate 410. The sacrificial material is then delineated by an appropriate method such as photolithography, so as to form a first sacrificial layer 480 having a predetermined shape.

Figure 7B:
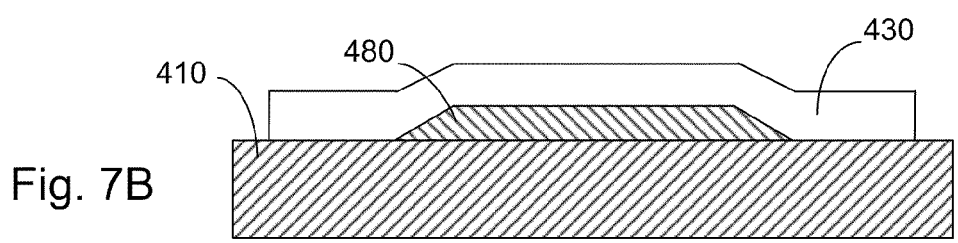

Next, as shown in FIG. 7B, a dielectric layer 430 is deposited on the first sacrificial layer 480 and on the substrate 410.

Figure 7C:
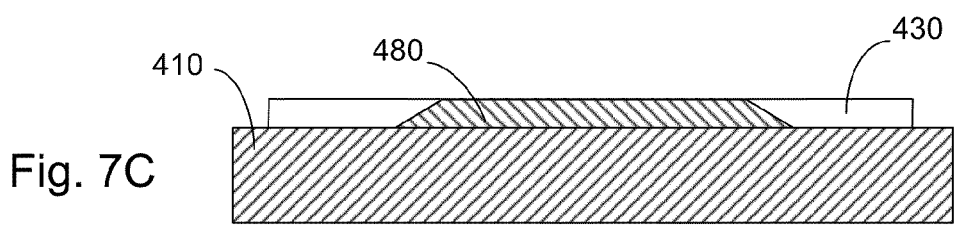

Afterwards, as shown in FIG. 7C, an upper portion of the dielectric layer 430 above the first sacrificial layer 480 is removed, for example, by chemical mechanical polishing (CMP) to form a completely planarized surface.

Figure 7D:
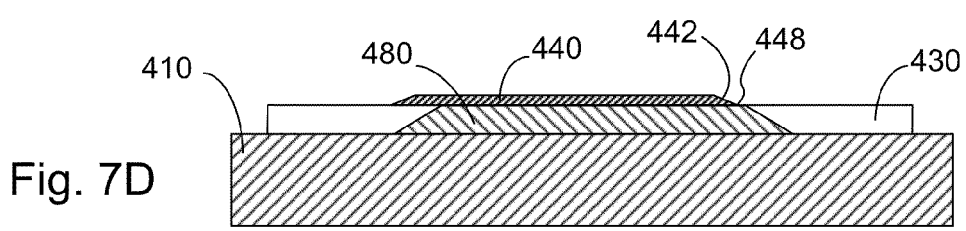

Subsequently, as shown in FIG. 7D, a first electrode material is deposited on the top surface of the dielectric layer 430 and over the first sacrificial layer 480. And the first electrode material is delineated so as to form a first electrode 440. For example, the first electrode 440 is etched with dry plasma or wet chemical etching process so as to form a tapered end portion 442. And an edge 448 of the first electrode 440 terminates within the contour of the first sacrificial layer 480.

Figure 7E:
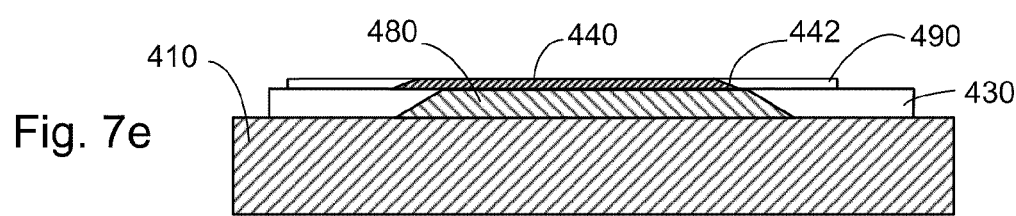

Next, as shown in FIG. 7E, a second sacrificial layer 490 is deposited on the first sacrificial layer 480 and the dielectric layer 430, and the second sacrificial layer 490 is processed to coincide with the tapered end portion 442 of the first electrode 440.

Figure 7F:
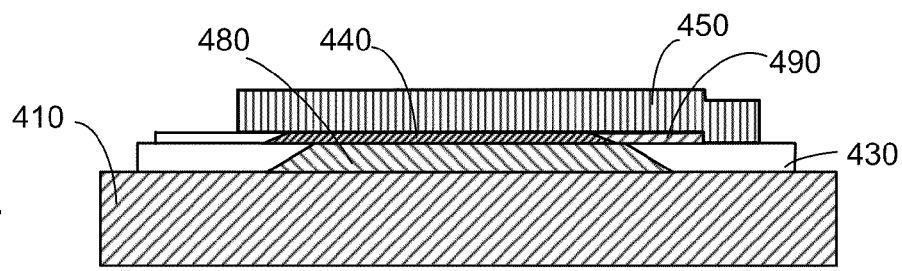

Afterwards, as shown in FIG. 7F, a piezoelectric layer 450 is deposited on the first electrode 440, the second sacrificial layer 490 and onto the dielectric layer 430. Thus, the piezoelectric layer 450 is isolated from the first electrode 440 by the second sacrificial layer 490 in a region overlapping the tapered end portion 442 of the first electrode 440.

Figure 7G:
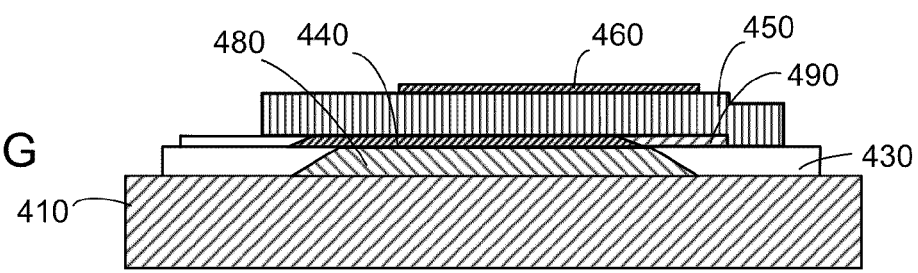

Subsequently, as shown in FIG. 7G, a second electrode material is deposited on the piezoelectric layer 450 and delineated to form a second electrode layer 460 having a portion situated above the first sacrificial layer 480.

Figure 7H:
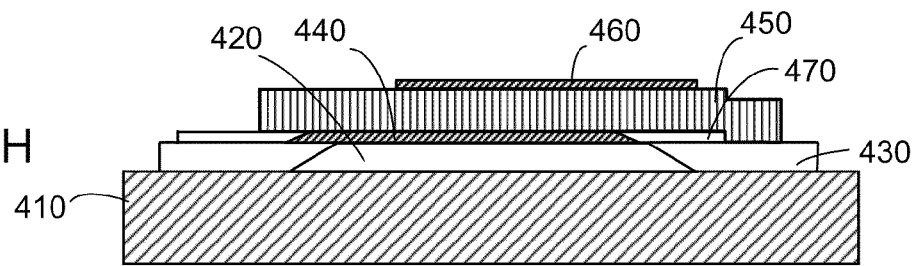

Finally, as shown in FIG. 7H, the first sacrificial layer 480 is removed so as to form an air cavity functioning as an acoustic mirror 420, and the second sacrificial layer 490 is removed so as to form a gap 470. The gap 470 isolates the piezoelectric layer 450 from the first electrode 440 in a region 466 overlapping the tapered end portion 442 of the first electrode 440, such that resonant excitation portion formed in the region 466 is minimally contributed into electrical response of the whole BAW resonator 400.

Figure 8:
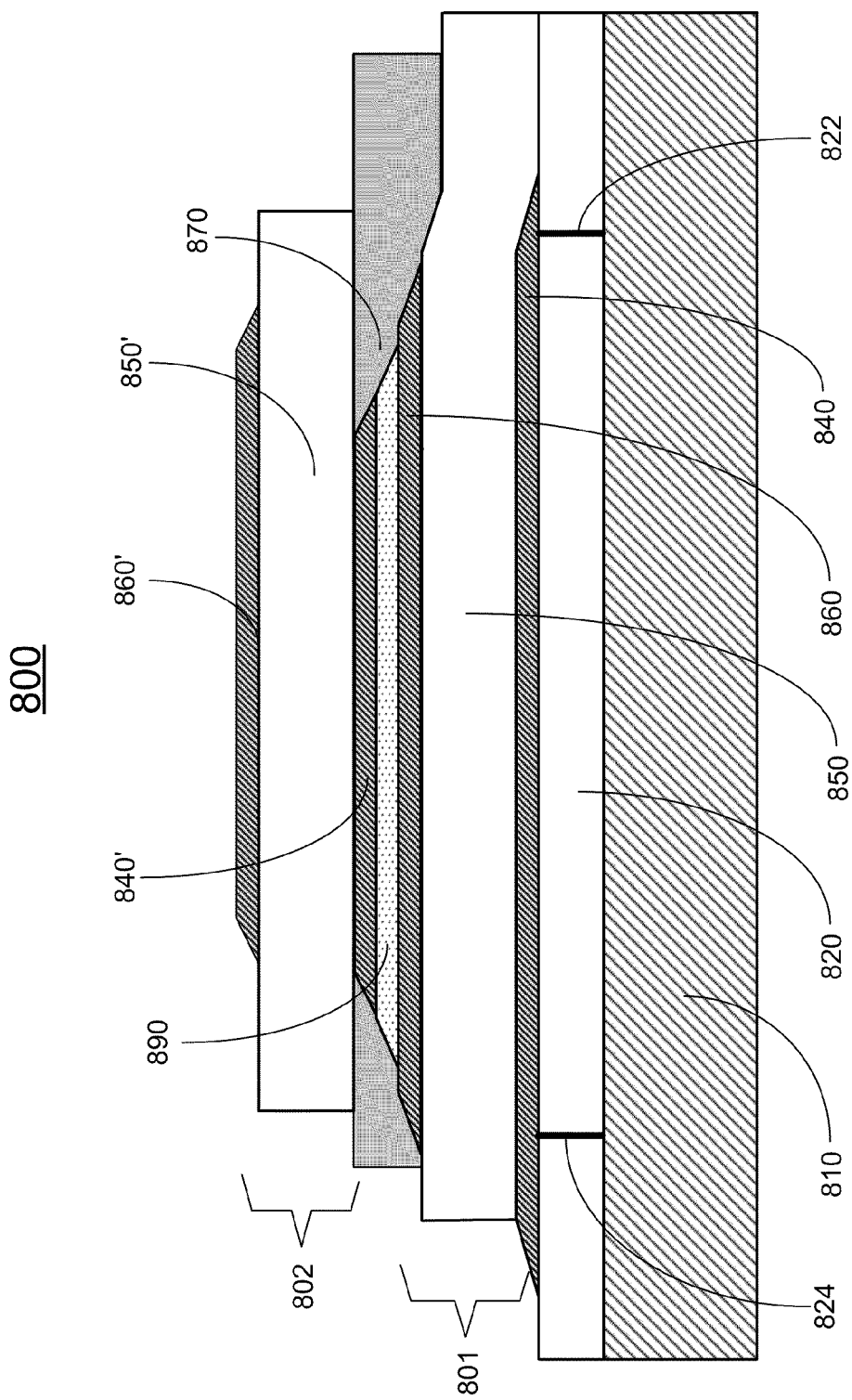
FIG. 8 shows a cross sectional view of a stacked BAW resonator according to one embodiment of the present invention.
Figure 10:
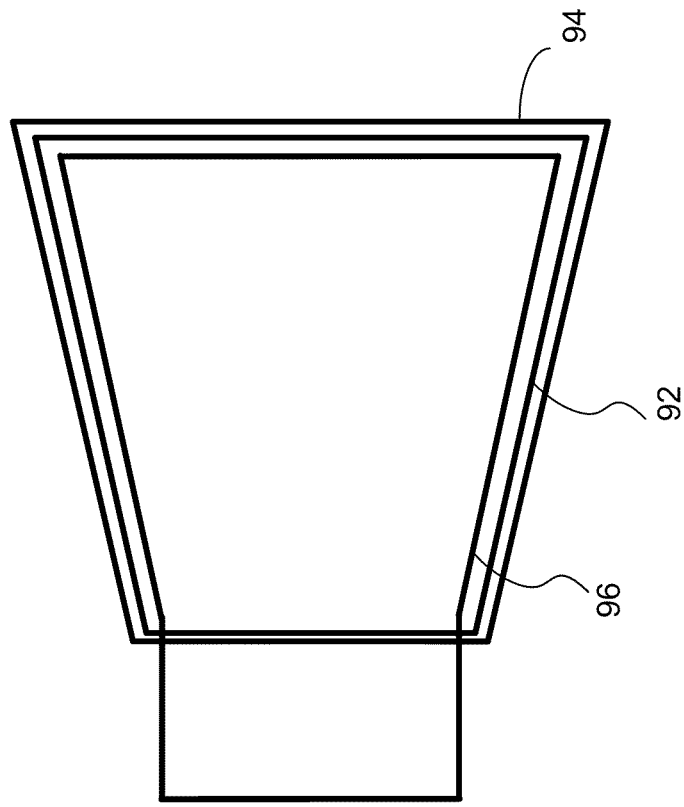
FIG. 10 shows a top view of another conventional BAW resonator.
Figure 9:
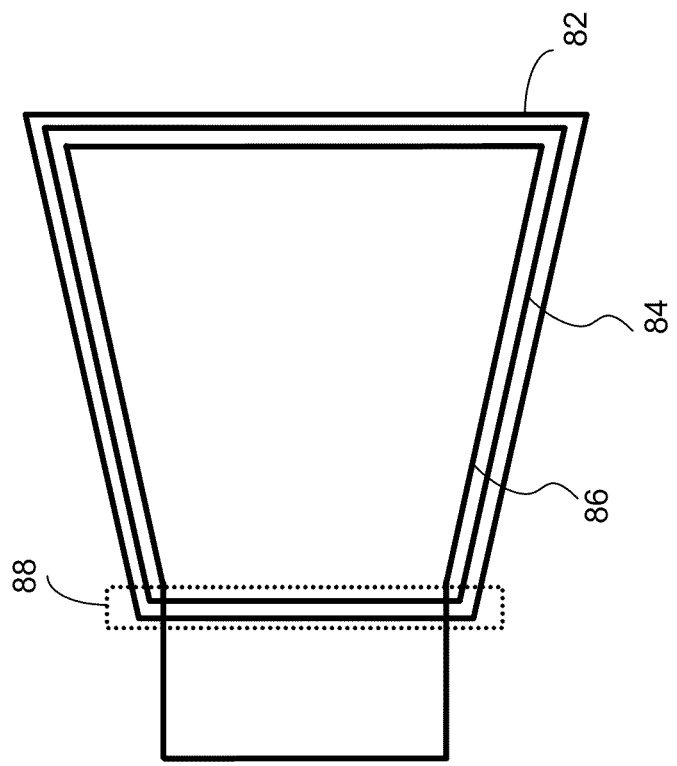
FIG. 9 shows a top view of a conventional BAW resonator.
Figure 11:
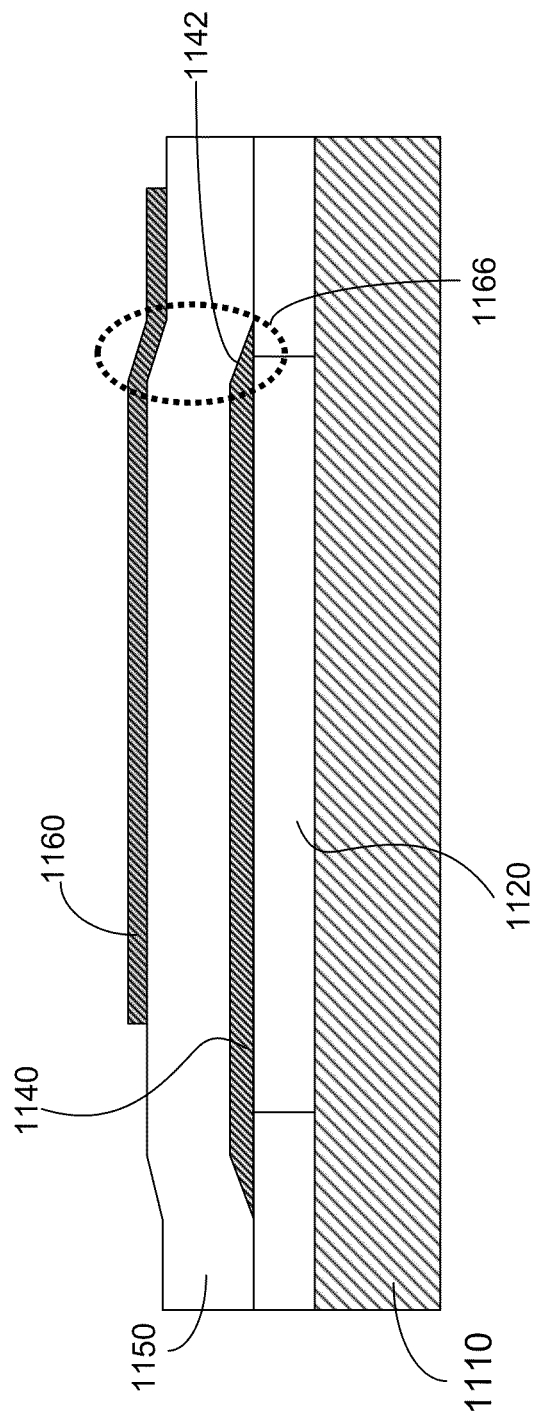
FIG. 11 shows a cross sectional view of a conventional BAW resonator.

Referring to FIG. 8, a coupled resonator filter (CRF) 800 is shown according to one embodiment of the present invention. CRF comprising at least two acoustically coupled BAW resonators in a stacked arrangement offers the possibility of a conversion of a single to a balanced signal within the filter. In the embodiment, the CRF 800 comprises an acoustic mirror 820 formed on a top surface of the substrate 810, having a first edge 822 and an opposite, second edge 824, and a plurality of multilayered piezoelectric structures 801, 802, . . . , stacked over the acoustic mirror 820. Each two adjacent multilayered piezoelectric structures, e.g., 801 and 802, are separated by a decoupling layer 890. Each multilayered piezoelectric structure 801 (802) comprises a first electrode 840 (840') having an end portion, a second electrode 860 (860') and a piezoelectric layer 850 (850') formed therebetween. For each multilayered piezoelectric structure, the first electrode or the second electrode and the piezoelectric layer define a gap (not shown) in a region that overlaps the end portion of the first electrode 840 (840'). The decoupling layer 890 comprises a single layer or a multilayer. In one embodiment, the gap is filled with a dielectric material, for example, planarized dielectric layer 870 enables highly oriented growth of PZ layer 850', or air. In addition, the dielectric layer encapsulates the decoupling layer 890 in case the decoupling layer 890 comprises material (e.g., $SiO_2$) that is potentially attacked by the etchant (e.g., HF acid) and/or delaminates during process step to remove sacrificial material and form the air cavity 820.

In summary, the present invention, among other things, recites BAW resonators and methods of fabricating the same. In various embodiments of the present invention, a gap or a dielectric layer is formed between at least one of the first electrode and the second electrode and the piezoelectric layer in a region overlapping the tapered end portion of the first electrode, resulting in resonant excitation portion formed by the poorly grown piezoelectric material in this region is minimally contributed into electrical response of the whole resonator. Therefore, nominal low cost isotropic wet etching process for the first electrode may be performed, and special care doesn't need to be taken to avoid the sharp discontinuity of the first electrode. The voltage drop in the step region of the piezoelectric layer is minimized by the gap or the dielectric layer between one of the first electrode and the second electrode and the piezoelectric film, thus has improved Q, $K_t^2$ and ESD robustness of the resonator.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic wave resonator, comprising:
   (a) a substrate;
   (b) an acoustic mirror formed in or on the substrate, having a first edge and an opposite, second edge;
   (c) a dielectric layer formed on the substrate such that the dielectric layer is substantially in contact with the first and second edges of the acoustic mirror;
   (d) a first electrode formed on the acoustic mirror, having a first end portion and an opposite, second end portion defining a body portion therebetween, wherein the second end portion is formed extending to the dielectric layer, and wherein the first end portion of the first electrode locates between the first and second edges of the acoustic mirror;
   (e) a piezoelectric layer formed on the first electrode, having a body portion, a first end portion and a second end portion oppositely extending from the body portion onto the dielectric layer; and
   (f) a second electrode formed on the piezoelectric layer, having a first portion situated on the body portion of the piezoelectric layer, and a second portion extending from the first portion such that the junction of the first portion and the second portion locates between the first and second edges of the acoustic mirror, and the second portion of the second electrode and the first end portion of the piezoelectric layer define a gap therebetween, wherein the second portion of the second electrode comprises a convex bridge,
   wherein thicknesses of the piezoelectric layer at the first end portion that defines the gap and at the remaining portion are substantially the same.

2. The acoustic wave resonator of claim 1, wherein the gap is filled with a dielectric material or air.

3. The acoustic wave resonator of claim 2, wherein the dielectric material comprises silicon oxide, silicon nitride, silicon carbide, porous silica, fluorinated amorphous carbon, fluoro-polymer, parylene, polyarylene ether, hydrogen silsesquioxane (HSQ), crosslinked polyphenylene polymer, bisbenzocyclobutene (BCB), fluorinated silicon dioxide, carbon doped oxide, diamond, or a combination of them.

4. The acoustic wave resonator of claim 1, wherein the first and second end portions of first electrode are formed to have a tapered profile, a stepwise profile or a vertical profile.

5. The acoustic wave resonator of claim 1, wherein the junction of the body portion and the first end portion of the first electrode and the junction of the first portion and the second portion of the second electrode define a distance, $d_2$.

6. An acoustic wave resonator comprising:
   (a) a substrate having a top surface;
   (b) an acoustic mirror formed on the top surface of the substrate or in the substrate, having a first edge and an opposite, second edge;
   (c) a dielectric layer formed on the substrate such that the dielectric layer is substantially in contact with the first and second edges of the acoustic mirror;
   (d) a first electrode formed over the substrate and overlying the acoustic mirror, having a first end portion and an opposite, second end portion, wherein the first end portion extends beyond one of the first and second edges of the acoustic mirror and situates on the dielectric layer, and the second end portion locates between the first and second edges of the acoustic mirror;
   (e) a piezoelectric layer formed on the first electrode and extending beyond the second end portion of the first electrode and onto the dielectric layer such that a gap is defined between the piezoelectric layer and the second end portion of the first electrode, wherein the gap is filled with air, wherein thicknesses of the piezoelectric layer at a portion that defines the gap and at the remaining portion are substantially the same; and
   (f) a second electrode deposited on the piezoelectric layer having a portion situated above the acoustic mirror and extending beyond the second end portion of the first electrode.

7. An acoustic wave resonator comprising:
   (a) a substrate having a top surface;
   (b) an acoustic mirror formed on the top surface of the substrate or in the substrate, having a first edge and an opposite, second edge;
   (c) a dielectric layer formed on the substrate such that the dielectric layer is substantially in contact with the first and second edges of the acoustic mirror;
   (d) a first electrode formed over the substrate and overlying the acoustic mirror, having a first end portion and an opposite, second end portion, wherein the first end portion extends beyond one of the first and second edges of the acoustic mirror and situates on the dielectric layer, and the second end portion locates between the first and second edges of the acoustic mirror;
   (e) a piezoelectric layer formed on the first electrode and extending beyond the second end portion of the first electrode and onto the dielectric layer such that the piezoelectric layer in a region overlapping both the first end portion and the second end portion of the first electrode is isolated from the first electrode, so that a gap is defined between the piezoelectric layer and the second end portion of the first electrode, wherein the gap is filled with a dielectric material having a dielectric constant, wherein thicknesses of the piezoelectric layer at a portion that defines the gap and at the remaining portion are substantially the same; and
   (f) a second electrode deposited on the piezoelectric layer having a portion situated above the acoustic mirror and extending beyond the second end portion of the first electrode.

8. The acoustic wave resonator of claim 7, wherein the dielectric material comprises silicon oxide, silicon nitride, silicon carbide, porous silica, fluorinated amorphous carbon, fluoro-polymer, parylene, polyarylene ether, hydrogen silsesquioxane (HSQ), crosslinked polyphenylene polymer, bisbenzocyclobutene (BCB), fluorinated silicon dioxide, carbon doped oxide, diamond, or a combination of them.

9. An acoustic wave resonator, comprising:
   (a) a substrate having a top surface;
   (b) an acoustic mirror formed on the top surface of the substrate or in the substrate, having a first edge and an opposite, second edge;
   (c) a first electrode formed on the acoustic mirror, having an end portion;
   (d) a piezoelectric layer formed on the first electrode, the piezoelectric layer having a body portion, a first end portion and a second end portion, and at least one of the first end portion and the second end portion extending beyond the end portion of the first electrode; and (e) a second electrode formed on the piezoelectric layer, wherein a gap is defined between the first electrode and the piezoelectric layer in a region that overlaps the end portion of the first electrode; and wherein thicknesses of the piezoelectric layer at the first end portion that defines the gap and at the remaining portion are substantially the same.

10. The acoustic wave resonator of claim 9, further comprising a dielectric layer formed on the substrate such that the dielectric layer is substantially in contact with the first and second edges of the acoustic mirror.

11. The acoustic wave resonator of claim 9, wherein the gap is filled with a dielectric material or air.

12. The acoustic wave resonator of claim 11, wherein the dielectric material comprises silicon oxide, silicon nitride, silicon carbide, porous silica, fluorinated amorphous carbon, fluoro-polymer, parylene, polyarylene ether, hydrogen silsesquioxane (HSQ), crosslinked polyphenylene polymer, bis-benzocyclobutene (BCB), fluorinated silicon dioxide, carbon doped oxide, diamond, or a combination of them.

13. An acoustic wave resonator, comprising:
  (a) an acoustic mirror formed in or on a top surface of the substrate, having a first edge and an opposite, second edge; and
  (b) a plurality of multilayered piezoelectric structures stacked over the acoustic mirror, wherein each two adjacent multilayered piezoelectric structures are separated by a decoupling layer, wherein each multilayered piezoelectric structure comprises a first electrode having an end portion, a second electrode and a piezoelectric layer formed therebetween, and wherein at least one of the first electrode and the second electrode and the piezoelectric layer define a gap in a region that overlaps the end portion of the first electrode, wherein the gap is filled with air.

14. The acoustic wave resonator of claim 13, wherein the decoupling layer comprises a single layer or a multilayer.

15. An acoustic wave resonator, comprising:
  (a) an acoustic mirror formed in or on a top surface of the substrate, having a first edge and an opposite, second edge; and
  (b) a plurality of multilayered piezoelectric structures stacked over the acoustic mirror, wherein each two adjacent multilayered piezoelectric structures are separated by a decoupling layer, wherein each multilayered piezoelectric structure comprises a first electrode having an end portion, a second electrode and a piezoelectric layer formed therebetween, and wherein at least one of the first electrode and the second electrode and the piezoelectric layer define a gap in a region that overlaps the end portion of the first electrode, wherein the gap is filled with a dielectric material.

16. A method of fabricating an acoustic wave resonator, comprising the steps of:
  (a) forming an acoustic mirror having a first edge and an opposite, second edge, on a top surface of a substrate or in the substrate;
  (b) forming a dielectric layer on the substrate such that the dielectric layer is substantially in contact with the first and second edges of the acoustic mirror;
  (c) forming a first electrode having an end portion, over the acoustic mirror, the end portion locating between the first and second edges of the acoustic mirror;
  (d) forming a piezoelectric layer on the first electrode and the dielectric layer; and
  (e) forming a second electrode on the piezoelectric layer such that the second electrode extends beyond the end portion of the first electrode to define a region in which the second electrode overlapping the end portion of the first electrode is isolated from the piezoelectric layer, comprising:
    (i) forming a first sacrificial layer on the piezoelectric layer such that the first sacrificial layer covers at least the region overlapping the end portion of the first electrode;
    (ii) depositing the second electrode on the piezoelectric layer and over the first sacrificial layer; and
    (iii) removing the first sacrificial layer to form a gap between the second electrode and the piezoelectric layer in the region overlapping the end portion of the first electrode,
  wherein thicknesses of the piezoelectric layer at a portion that defines the gap and at the remaining portion are substantially the same.

17. The method of claim 16, wherein the step of forming the acoustic mirror comprises the step of forming an air cavity functioning as the acoustic mirror on the top surface of the substrate or in the substrate.

18. The method of claim 17, wherein the step of forming the air cavity comprises the step of forming a second sacrificial layer having a shape of the acoustic mirror on the top surface of the substrate.

19. The method of claim 18, further comprising the step of removing the second sacrificial layer from the substrate to form the acoustic mirror thereon.

20. A method of fabricating an acoustic wave resonator, comprising the steps of:
  (a) forming an acoustic mirror having a first edge and an opposite, second edge, on a top surface of a substrate or in the substrate;
  (b) forming a dielectric layer on the substrate such that the dielectric layer is substantially in contact with the first and second edges of the acoustic mirror;
  (c) forming a first electrode having an end portion, over the acoustic mirror, the end portion locating between the first and second edges of the acoustic mirror;
  (d) forming a piezoelectric layer on the first electrode and the dielectric layer; and
  (e) forming a second electrode on the piezoelectric layer such that the second electrode extends beyond the end portion of the first electrode to define a region in which the second electrode overlapping the end portion of the first electrode is isolated from the piezoelectric layer, comprising:
    (i) forming a second dielectric layer on the piezoelectric layer such that the dielectric layer covers at least the region overlapping the end portion of the first electrode; and
    (ii) depositing the second electrode on the piezoelectric layer and over the second dielectric layer,
  wherein thicknesses of the piezoelectric layer at a portion on which the second dielectric layer is formed and at the remaining portion are substantially the same.

21. A method of fabricating an acoustic wave resonator, comprising the steps of:
  (a) forming an acoustic mirror having a first edge and an opposite, second edge, on a top surface of a substrate or in the substrate;
  (b) forming a dielectric layer on the substrate such that the dielectric layer is substantially in contact with the first and second edges of the acoustic mirror;
  (c) forming a first electrode having a first end portion and an opposite, second end portion, over the acoustic mirror, wherein the first end portion extends beyond the first edge of the acoustic mirror and onto the dielectric layer and wherein the second end portion extends beyond the second edge of the acoustic mirror or locates between the first and second edges of the acoustic mirror;

(d) forming a piezoelectric layer on the first electrode and extending beyond both the first and second end portions of the first electrode and crossing over both the first and second end portions of the first electrode layer so as to define a region in which the piezoelectric layer crossing over both the first and second end portions of the first electrode layer is isolated from the first electrode layer, wherein a gap is defined between the piezoelectric layer and the first electrode in the defined region; and (e) forming a second electrode deposited on the piezoelectric layer having a portion situated above the acoustic mirror and extending beyond at least one of the first and second end portions of the first electrode and the defined region.

22. The method of claim 21, wherein the step of forming the piezoelectric layer comprises the steps of:

(i) depositing a dielectric film on the end portion of the first electrode and an area of the dielectric layer surrounding at least one of the first end portion and the second end portion of the first electrode to form a planarized surface thereon; and (ii) growing the piezoelectric layer on the planarized surface.

* * * * *